(12) United States Patent
Mao et al.

(10) Patent No.: US 10,873,342 B2
(45) Date of Patent: Dec. 22, 2020

(54) METHOD AND DEVICE FOR SENDING AND RECEIVING DATA AND DATA TRANSMISSION SYSTEM

(75) Inventors: Xingzhong Mao, Beijing (CN); Wei Xie, Beijing (CN)

(73) Assignees: BEIJING LENOVO SOFTWARE LTD., Beijing (CN); LENOVO (BEIJING) CO., LTD., Beijing (CN)

( * ) Notice: Subject to any disclaimer, the term of this patent is extended or adjusted under 35 U.S.C. 154(b) by 1180 days.

(21) Appl. No.: 13/697,315

(22) PCT Filed: May 10, 2011

(86) PCT No.: PCT/CN2011/073880
§ 371 (c)(1),
(2), (4) Date: Nov. 9, 2012

(87) PCT Pub. No.: WO2011/140970
PCT Pub. Date: Nov. 17, 2011

(65) Prior Publication Data
US 2013/0060899 A1    Mar. 7, 2013

(30) Foreign Application Priority Data
May 11, 2010 (CN) .......................... 2010 1 0171520

(51) Int. Cl.
*H03M 7/30*    (2006.01)
(52) U.S. Cl.
CPC ..................................... *H03M 7/30* (2013.01)
(58) Field of Classification Search
CPC ....................................................... H03M 7/30
See application file for complete search history.

(56) References Cited

U.S. PATENT DOCUMENTS

| 2002/0071138 A1* | 6/2002 | Ohara | G06K 15/00 |
| | | | 358/1.15 |
| 2004/0190611 A1* | 9/2004 | Nakajima | H04N 19/159 |
| | | | 375/240.03 |

(Continued)

FOREIGN PATENT DOCUMENTS

| CN | 1898699 | 1/2007 |
| CN | 101119454 | 2/2008 |

(Continued)

OTHER PUBLICATIONS

Beijing Lenovo Software Ltd.; Method and Device for Sending and Receiving Data and Data Transmission System Thereof; PCT/WO2011140970A1 dated Nov. 17, 2011; 33 Pages.

(Continued)

*Primary Examiner* — Jamie J Atala
*Assistant Examiner* — Hesham K Abouzahra
(74) *Attorney, Agent, or Firm* — Radlo & Su; Peter Su

(57) ABSTRACT

The embodiments of the invention provide a method and device for sending and receiving data and a data transmission system thereof. The sending method includes the following steps: acquiring a first data corresponding to a transmission unit with a specific transmission format, wherein the first data has a first data amount which is equal to the data amount of the transmission unit; acquiring a second data which corresponds to the transmission unit and has a second data amount; obtain a compressed data with a compressed data amount, wherein the compressed data amount is equal to or smaller than the data amount of the transmission unit; sending the compressed data.

14 Claims, 7 Drawing Sheets

(56) References Cited

U.S. PATENT DOCUMENTS

| | | | | |
|---|---|---|---|---|
| 2006/0188168 | A1* | 8/2006 | Sheraizin | G06T 5/002 |
| | | | | 382/254 |
| 2007/0140554 | A1* | 6/2007 | Strom | H04N 19/98 |
| | | | | 382/166 |
| 2007/0233783 | A1 | 10/2007 | Tanimoto | |
| 2008/0063078 | A1 | 3/2008 | Futenma et al. | |
| 2008/0221904 | A1 | 9/2008 | Cosatto et al. | |
| 2009/0100125 | A1* | 4/2009 | McDowell | G06F 16/9574 |
| | | | | 709/203 |
| 2011/0109792 | A1* | 5/2011 | Montag | H04L 65/80 |
| | | | | 348/390.1 |

FOREIGN PATENT DOCUMENTS

| | | |
|---|---|---|
| CN | 101416220 | 4/2009 |
| CN | 101682746 | 3/2010 |
| CN | 101753868 | 6/2010 |

OTHER PUBLICATIONS

English Abstract of CN1898699; 2 Pages.
English Abstract of CN101416220; 1 Page.
English Abstract of CN101119454; 1 Page.
Chinese Patent Application No. 201010171520.0, Chinese Patent Office, Third Office Action dated Feb. 17, 2014; 4 pages.
English Translation of the Text of the Third Office Action Communication for Chinese Patent Application No. 201010171520.0, Chinese Patent Office, Office Action dated Feb. 17, 2014; 4 pages.
English Abstract of CN 101753868 A, 1 page.
English Abstract of CN 101682746 A, 1 page.
Beijing Lenovo Software Ltd. et al., English Translation of the Patent Cooperation Treat PCT International Preliminary Report on Patentability, International Bureau of WIPO; International Application No. PCT/CN2011/073880, Nov. 13, 2012; 9 pages.
Chinese Patent Application No. 201010171520.0, Chinese Patent Office, First Office Action dated Oct. 22, 2012; 6 pages.
English Translation of the Text of the First Office Action Communication for Chinese Patent Application No. 201010171520.0, Chinese Patent Office, Office Action dated Oct. 22, 2012; 5 pages.
Chinese Patent Application No. 201010171520.0, Chinese Patent Office, Second Office Action dated Jul. 25, 2013; 3 pages.
English Translation of the Second Office for Chinese Patent Application No. 201010171520.0, Chinese Patent Office, Office Action dated Jul. 25, 2013; 1 page.

* cited by examiner

METHOD AND DEVICE FOR SENDING AND RECEIVING DATA AND DATA TRANSMISSION SYSTEM

CROSS REFERENCE TO RELATED APPLICATIONS

This application is a national phase application based on international application No. PCT/CN2011/073880, filed May 10, 2011, and claims priority of Chinese Patent Application No. CN 201010171520.0, filed May 11, 2010, the contents of both of which are incorporated by reference herein in their entireties.

BACKGROUND

The present invention relates to a method and device for sending and receiving data and data transmission system thereof.

With the development of multimedia technology, multimedia standards such as HDMI have gained more and more applications. The maximum bandwidth of HDMI can be up to 5 GB, which solves the problem of bandwidth in the transmission of high definition data of 1080 p and the like. However, usually, there is no channel for synchronously transmitting user data in such multimedia standards; therefore, the advantage of high bandwidth of HDMI cannot be utilized by multimedia data having real-time synchronization requirement to transmit the user data and the multimedia data synchronously from computers (PCs) or the Internet.

For example, currently, the function of Overlay is often used in computer (PC) video and image processing, such that a specific display effect is achieved by mixing two-layer or multi-layer data, for example an Alpha value (as the user data). In general, an image displayed on a screen is composed of pixels, each pixel is composed of image data. In the image having the user data, each pixel has respective user data in addition to required image data. That is to say, a larger amount of data than that of the image data needs to be transmitted when any pixel, having the user data, is transmitted. However, in the transmission conforming to the HDMI standard, since only channels for transmitting the image data are set in a HDMI interface and no channel for transmitting the user data in real time is set therein, the application for the multimedia data having real-time user data from PCs or the Internet is limited.

A known solution is to transmit two image data sources so as to achieve the effect of Picture In Picture (PIP) or display in separate screens. However, in this transmission mode, the received two paths of images can only be displayed independently without being mixing-processed at the receiving end. In this transmission mode, the receiver can simply display the received two paths of images or set the covering relation (such as complete covering, i.e., the Picture In Picture effect) therebetween, without performing complicated mixing display processing on them. As shown in FIG. 1, when the transmitted two paths of images are display in the effect of Picture In Picture (PIP), a part of a first picture 110 is covered by a second picture 120. That is to say, although the first picture 110 and the second picture 120 can be displayed at the same time, they are still two independent pictures without any mixture of their picture contents. It is not convenient to set effects such as transparency for images in the existing solution.

The same applies to other multimedia data such as audio data, video data and others. To this end, it is necessary to transmit the user data in synchronization with the multimedia data through multimedia interfaces such as HDMI or DisplayPort.

SUMMARY

In view of the problem mentioned above, it is desired to provide a method and device for sending and receiving data and corresponding data transmission system, so that even in the case of inadequate channels, content mixture of multipath data sources can be achieved and user experience can be improved.

In accordance with one embodiment of the present invention, there is provided a data sending method, comprising acquiring a first data corresponding to a transmission unit with a specific transmission format, wherein the first data has a first data amount which is equal to the data amount of the transmission unit; acquiring a second data which corresponds to the transmission unit and has a second data amount; obtaining a compressed data with a compressed data amount, wherein the compressed data amount is equal to or smaller than the data amount of the transmission unit; sending the compressed data.

In accordance with another embodiment of the present invention, there is provided a data receiving method, comprising receiving a compressed data with a compressed data amount, wherein the compressed data is obtained by compressing a first data and a second data corresponding to a transmission unit with a specific transmission format, the first data having a first data amount which is equal to the data amount of the transmission unit, the compressed data amount being equal to or smaller than the data amount of the transmission unit; decompressing the received compressed data so as to obtain a fourth data and a fifth data, wherein the fourth data corresponds to the first data, and the fifth data corresponds to the second data.

In accordance with another embodiment of the present invention, there is provided a data sending apparatus, comprising a first acquiring module for acquiring a first data corresponding to a transmission unit with a specific transmission format, wherein the first data has a first data amount which is equal to the data amount of the transmission unit; a second acquiring module for acquiring a second data which corresponds to the transmission unit and has a second data amount; a compressing module for compressing the first data acquired by the first acquiring module and the second data acquired by the second acquiring module so as to obtain a compressed data with a compressed data amount, wherein the compressed data amount is equal to or smaller than the data amount of the transmission unit; a sending module for sending the compressed data compressed by the compressing module.

In accordance with another embodiment of the present invention, there is provided a data receiving apparatus, comprising: a receiving module for receiving a compressed data with a compressed data amount, wherein the compressed data is obtained by compressing a first data and a second data corresponding to a transmission unit with a specific transmission format, the first data having a first data amount which is equal to the data amount of the transmission unit, the compressed data amount being equal to or smaller than the data amount of the transmission unit; a decompressing module for decompressing the compressed data received by the receiving module so as to obtain a fourth data and a fifth data, wherein the fourth data corresponds to the first data, and the fifth data corresponds to the second data.

In accordance with another embodiment of the present invention, there is provided a data transmitting system, comprising a sending apparatus and a receiving apparatus, the data comprising a first data and a second data corresponding to each pixel. The sending apparatus comprises: a first acquiring module for acquiring the first data corresponding to a transmission unit with a specific transmission format, wherein the first data has a first data amount which is equal to the data amount of the transmission unit; a second acquiring module for acquiring the second data which corresponds to the transmission unit and has a second data amount; a compressing module for compressing the first data acquired by the first acquiring module and the second data acquired by the second acquiring module so as to obtain a compressed data with a compressed data amount, wherein the compressed data amount is equal to or smaller than the data amount of the transmission unit; a sending module for sending the compressed data compressed by the compressing module. The receiving apparatus comprises: a receiving module for receiving a compressed data with a compressed data amount, wherein the compressed data is obtained by compressing a first data and a second data corresponding to a transmission unit with a specific transmission format, the first data having a first data amount which is equal to the data amount of the transmission unit, the compressed data amount being equal to or smaller than the data amount of the transmission unit; a decompressing module for decompressing the compressed data received by the receiving module so as to obtain a fourth data and a fifth data, wherein the fourth data corresponds to the first data, and the fifth data corresponds to the second data.

By using the method and device for sending and receiving data and data transmission system thereof of embodiments of the invention, synchronous transmission of multipath data sources (for example, synchronous transmission of user data and multimedia data) can be achieved even in the case of inadequate channels or in the case that channel bandwidth cannot meet transmission requirements, so that content mixture processing, such as overlay editing, can be performed for multipath multimedia data sources, other functions customized by uses can be achieved, and special applications can be provided for products.

BRIEF DESCRIPTION OF THE DRAWINGS

FIG. 6 is a block diagram showing a data sending apparatus according to one embodiment of the present invention;

DETAILED DESCRIPTION

Figure 1:
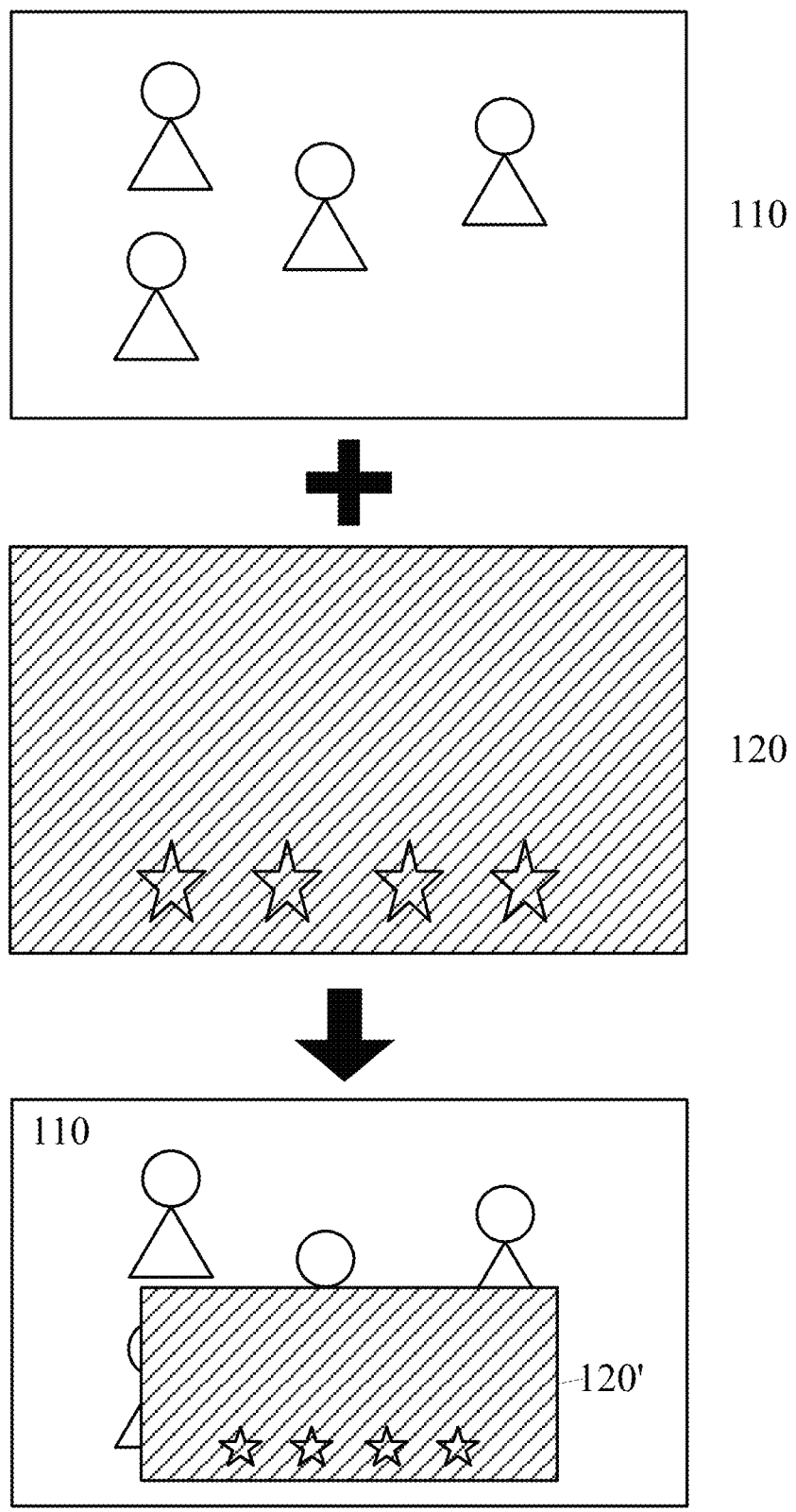
FIG. 1 is an illustration diagram showing an example of the Picture In Picture effect in the prior art.

Hereinafter, embodiments of the present invention will be described in detail with reference to the accompanying drawings. It should be noted that, in the present description and accompanying drawings, essentially identical steps and elements are denoted by the same reference numerals, and repeated explanation for these steps and elements will be omitted.

A data sending method according to one embodiment of the present invention will be described below with reference to FIG. 2.

Figure 2:
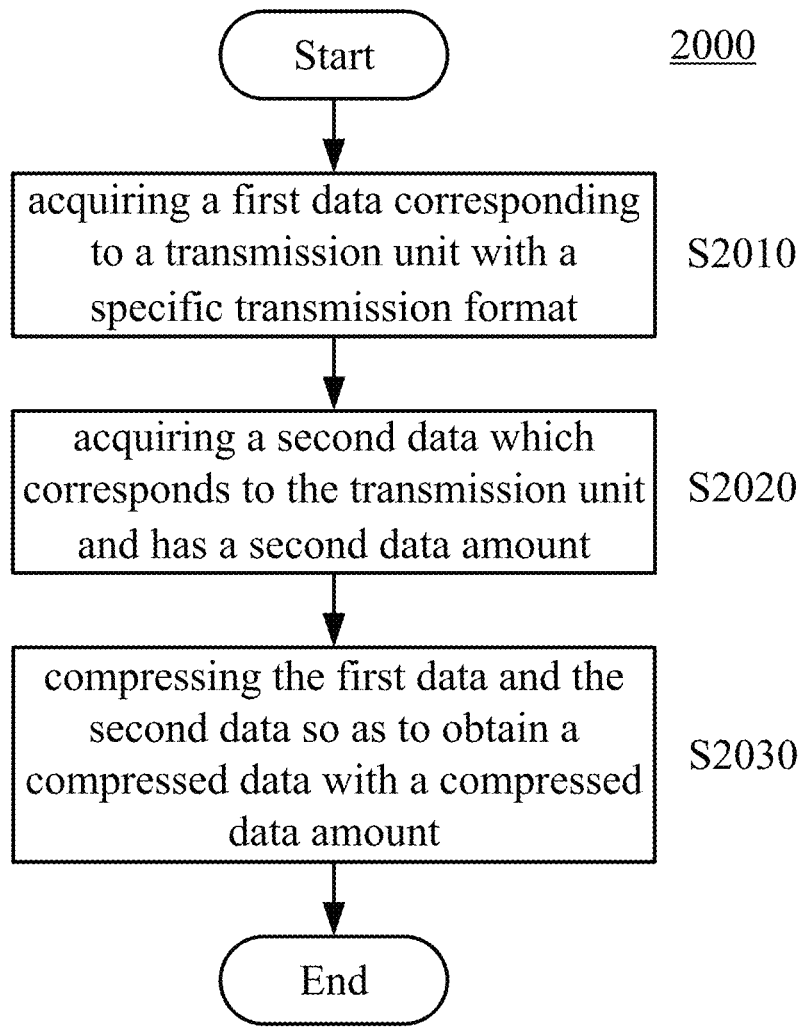
FIG. 2 is a flowchart showing a data sending method according to one embodiment of the present invention.

FIG. 2 is a flowchart showing a data sending method 2000 according to one embodiment of the present invention. In the data sending method of FIG. 2, data is sent in a transmission unit with a specific transmission format. In step S2010, a first data corresponding to a transmission unit with a specific transmission format is acquired. The first data has a first data amount, which is equal to the data amount of the transmission unit. In step S2020, a second data, which corresponds to the transmission unit and has a second data amount, is acquired. That is to say, the sum of the data amount contained in the original first and second data is larger than the data amount specified by the transmission unit, therefore the original first and second data cannot be transmitted in one transmission unit. The first data may be video data, audio data, image data, and the like. The second data may be user data, system information data, and the like. The particular contents of the first data and the second data do not constitute a limitation on the scope of the present invention.

In step S2030, the first data and the second data are compressed so as to obtain a compressed data with a compressed data amount. The compressed data amount contained in the compressed data after compressing is equal to or smaller than the data amount of the transmission unit. Various methods can be employed for the compression as required. Since the data amount contained in the compressed data is equal to or smaller than that of the transmission unit with the specific transmission format, the first data corresponding to the transmission unit and the second data corresponding to the transmission unit can be sent in one transmission unit in this specific transmission format. In step S2040, the compressed data is sent.

Compressing the first data and the second data so as to obtain the compressed data with the compressed data amount (step S2030) in FIG. 2 will be illustrated in detail below with reference to FIG. 3.

Figure 3:
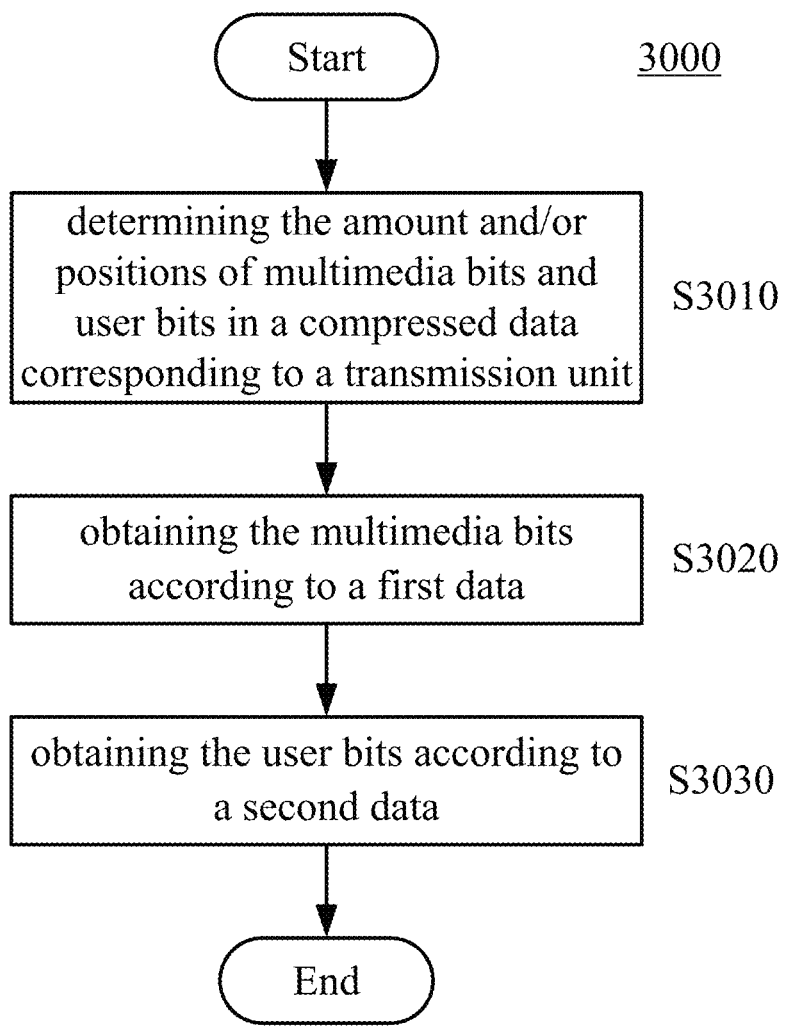
FIG. 3 is a flowchart showing that a first data and a second data are compressed so as to obtain a compressed data with a compressed data amount according to one embodiment of the present invention.

FIG. 3 shows a flowchart of a method 3000 of compressing a first data and a second data so as to obtain a compressed data with a compressed data amount, according to one embodiment of the present invention. As shown in FIG. 3, according to one embodiment of the present invention, in step S3010, the amount and/or positions of multimedia bits and user bits in a compressed data corresponding to a transmission unit are determined. For example, in the case in which the formats of the first data and the second data are not changed frequently, the positions of the multimedia bits and the user bits in the compressed data can be set previously at the sending end and the receiving end, and when the data is sent, the positions set previously are directly employed as the positions of the multimedia bits and the user bits without resetting them for each data transmission. On the contrary, in the case in which the formats of the first data and the second data vary frequently, the positions of the multimedia bits and the user bits can be reset as required before the data is sent, and the reset position information can be sent. Alternatively, according to different design requirements, the amount of the multimedia bits and the user bits in the compressed data can be set previously at the sending end and the receiving end; or the amount of the multimedia bits and the user bits can be reset before the data is sent and the reset amount information can be sent. Furthermore, the amount and positions of the multimedia bits and the user bits can also be set as required.

In step S3020, the multimedia bits are obtained according the first data. In step S3030, the user bits are obtained according the second data. For example, bits having more information amount indicating multimedia information can be selected from the first data as the multimedia bits according to the amount and/or position of the multimedia bits determined in step S3010. Similarly, bits having more information amount indicating user information can be selected from the second data as the user bits according to the amount and/or position of the user bits determined in step S3010. Furthermore, the first data can also be encoded as the multimedia bits according to the amount and/or position of the multimedia bits determined in step S3010. Similarly, the second data can be encoded as the user bits according to the amount and/or position of the user bits determined in step S3010.

Alternatively, in another embodiment of the present invention, compressing the first data and the second data so as to obtain the compressed data with the compressed data amount can also be achieved in the following way. The first data and the second data are first combined so as to obtain a third data. As mentioned above, the sum of the amount of data contained in the original first and second data is larger than the data amount specified by the transmission unit, that is to say, the data amount contained in the third data is larger than that specified by the transmission unit. The third data is then encoded so as to obtain the compressed data.

The methods shown in FIGS. 2 and 3 will be described in detail below by taking the case in which video data having an Alpha value as the user data and having the RGB format are sent by using a HDMI bus as an example.

In this embodiment, the first data may be image data and the second data may be user data, and the specific transmission format may be the HDMI transmission format. Image data having formats of RGB, YCbCr, YC Mux or the like is transmitted in transmission units of pixels in accordance with the HDMI protocol. The HDMI protocol does not allow user data and image data corresponding to pixels to be transmitted synchronously in units of the pixels.

Table 1 and Table 2, respectively, show the structure of pixel data of the RGB format not having an Alpha value and the structure of pixel data of the RGB format having an Alpha value, by taking the RGB format as the image data and the Alpha value as the user data.

TABLE 1

The structure of pixel data of the RGB format not having an Alpha value.

| R[7:0] | G[7:0] | B[7:0] |
|--------|--------|--------|
| 8 bits | 8 bits | 8 bits |

TABLE 2

The structure of pixel data of the RGB format having an Alpha value.

| R[7:0] | G[7:0] | B[7:0] | Alpha[7:0] |
|--------|--------|--------|------------|
| 8 bits | 8 bits | 8 bits | 8 bits     |

In the embodiments of the present description, R[7:0] denotes 8-bit data from R[0] to R[7]. Similarly, G[7:0] and B[7:0] denote 8-bit data from G[0] to G[7] and 8-bit data from B[0] to B[7], respectively. As shown in Table 1, in the HDMI protocol, each color of red (R), green (G) and blue (B) contains 8-bit color-value data, i.e., R[0] to R[7], G[0] to G[7], and B[0] to B[7]. The pixel data of each pixel only contains 24-bit RGB image data but no user data and is sent in transmission units of pixels containing 24-bit data amount.

As shown in Table 2, in addition to the 24-bit RGB image data, there is a 8-bit alpha value (i.e., Alpha[0] to Alpha[7]), which is the user data in video data (achieving the Overlay function) from PCs or the Internet. In this case, each pixel data contains the 24-bit RGB image data and the 8-bit user data, that is, the amount of the pixel data is 32 bits.

In accordance with the data compressing methods shown in FIGS. 2 and 3, when pixel data having a Alpha value is sent, a first data corresponding to a transmission unit with a specific transmission format is first acquired, that is, image data corresponding to one pixel in the HDMI protocol is first acquired in step S2010 of the method 2000. As shown in Table 2, the acquired image data has 8-bit data of red color-value, 8-bit data of green color-value, and 8-bit data of blue color-value. Then, in step 2020 of the method 2000, a second data, which corresponds to the transmission unit and has a second data amount, is acquired. A 8-bit alpha value corresponding to one pixel is acquired as, shown in Table 2. In accordance with the method shown in FIG. 3, the amount and/or positions of multimedia bits and user bits in a compressed data corresponding to the transmission unit are determined in step S3010 of the method 3000. In this embodiment, it is previously determined that, with respect to each pixel, the uppermost 6 bits of the color-value data of each color are selected as the multimedia bits, the uppermost 6 bits of the alpha value are selected as the user bits, and the user bits are divided evenly into 3 groups to be respectively appended after the multimedia bits of each color so as to constitute the compressed data. Then, the multimedia bits are obtained according the first data, that is, the multimedia bits are obtained according to the original R, G, and B color-value data in step S3020 of the method 3000. In particular, it is previously determined that the multimedia bits are obtained by selecting the uppermost 6-bit data in the color-value data of each color. As known by those skilled in the art, 8-bit color-value data of each color represents a value from 0 to 255, and the lower the position of a bit is, the smaller the value the bit represents is. Therefore, the lowermost 2-bit data is discarded in this embodiment. In step S3030 of the method 3000, the user bits are obtained according the second data, that is, the user bits are obtained by selecting the uppermost 6-bit data in the original alpha value, and the lowermost 2-bit data is discarded since information amount contained in lower bits is less. Furthermore, 6-bit data in the lower position can also be selected when the upper bits are zero, that is, no user information is contained. The selected 6-bit data are divided into 3 groups to be respectively placed after the multimedia bits of three colors of R, G, and B so as to form the compressed 24-bit data. Finally turning back to the method shown in FIG. 2, the compressed data is sent, that is, the compressed data is sent through the HDMI bus in step S2040 of the method 2000. The structure of the compressed pixel data is shown in Table 3.

TABLE 3

| The structure of the compressed pixel data. | | |
|---|---|---|
| R[7:2], Alpha [7:6] | G[7:2], Alpha [5:4] | B[7:2], Alpha [3:2] |
| 8 bits | 8 bits | 8 bits |

As shown in Table 3, the uppermost 6-bit data in the color-value data of each color (i.e., R[2] to R[7], G[2] to G[7], and B[2] to B[7]) and the uppermost 6-bit data in the alpha value (i.e., Alpha[2] to Alpha[7]) are reserved in the compressed data. Thus, the compressed pixel data only has 24 bits and can be sent in one transmission unit (pixel) in accordance with the HDMI protocol.

The determined multimedia bits and user bits can also be combined in other orders. For example, the first 18 bits in 24 bits of the compressed data can be set as the multimedia bits and the selected R[2] to R[7], G[2] to G[7], and B[2] to B[7] can be disposed in these 18 bits, and the last 6 bits in 24 bits of the compressed data can be set as the user bits and the selected Alpha[2] to Alpha[7] can be disposed in these 6 bits. The particular sequencing methods do not constitute a limitation on the present invention. Furthermore, the positions of the multimedia bits and the user bits can be set previously at the sending end and the receiving end; or the positions of the multimedia bits and the user bits can also be reset as required and, the reset position information can be sent to the receiver.

In another embodiment of the present invention, the first data may be audio data and the second data may be user data, and the specific transmission format may be the HDMI transmission format. In accordance with the HDMI protocol, the audio data is transmitted in transmission units of samples, each of which has 24 bits. Because sound channels always present in pairs and user data of one sound channel is the complement code of user data of the other sound channel in the HDMI protocol, only user data of one sound channel needs to be transmitted in the transmission procedure, and user data of the other sound channel can be obtained by complement code calculation. Similar to the image data, the HDMI protocol does not support synchronously transmitting user data and audio data corresponding to samples in each sound channel in units of the samples. Since only user data of one of the paired sound channels needs to be transmitted, 8-bit user data can be divided into 2 groups of 4-bit user data so as to be respectively sent in synchronization with the respective audio data in each of the paired sound channels in the sending method similar to the above method for sending image data and user data. It will not be described in particular for the sake of simplicity.

Figure 4:
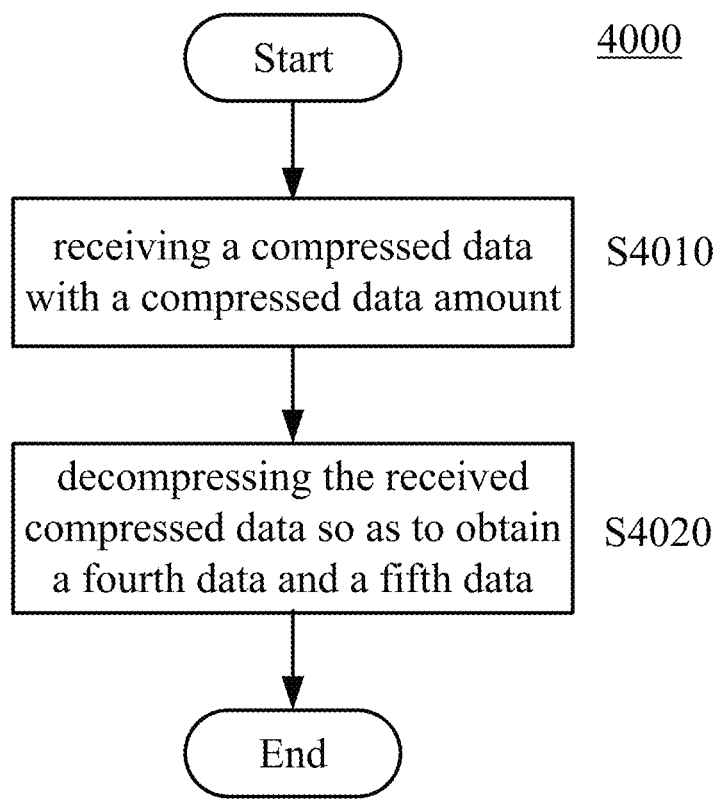
FIG. 4 is a flowchart showing a data receiving method according to one embodiment of the present invention.

A data receiving method according to one embodiment of the present invention will be described below with reference to FIG. 4. FIG. 4 is a flowchart showing a data receiving method 4000 according to one embodiment of the present invention. As shown in FIG. 4, according to one embodiment of the present invention, a compressed data with a compressed data amount is received in step S4010. In this embodiment, the compressed data is obtained by compressing a first data and a second data corresponding to a transmission unit with a specific transmission format. The first data has a first data amount, which is equal to the data amount of the transmission unit, and the compressed data amount is equal to or smaller than the data amount of the transmission unit. In step S4010, the received compressed data is decompressed so as to obtain a fourth data and a fifth data. The fourth data corresponds to the first data and a fifth data corresponds to the second data.

Decompressing the received compressed data so as to obtain the fourth data and the fifth data (step S4020) in FIG. 4 will be illustrated in detail below with reference to FIG. 5.

Figure 5:
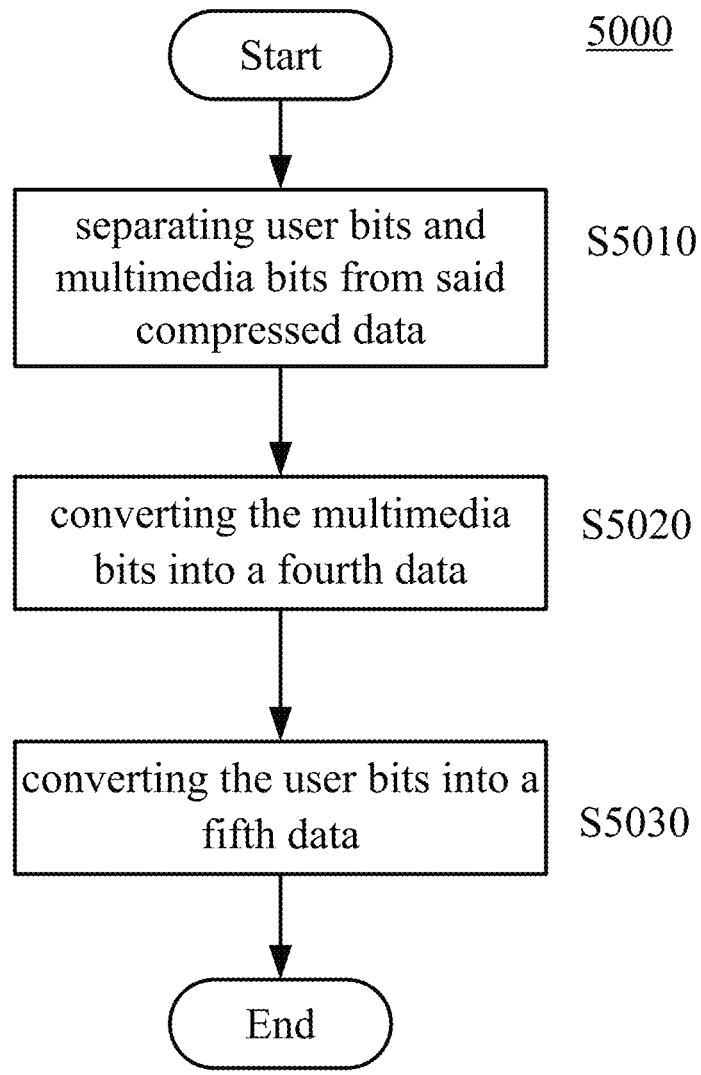
FIG. 5 is a flowchart showing that a received compressed data is decompressed so as to obtain a fourth data and a fifth data according to one embodiment of the present invention.

FIG. 5 shows a flowchart of a method 5000 for decompressing a received compressed data so as to obtain a fourth data and a fifth data, according to one embodiment of the present invention. As shown in FIG. 5, according to one embodiment of the present invention, in step S5010, said user bits and multimedia bits are separated from the compressed data. For example, the determined amount and/or positions of the multimedia bits and the user bits in said compressed data corresponding to the transmission unit can be received, and said user bits and multimedia bits can be separated according to the amount and/or positions. As mentioned above, in the case in which the positions of the multimedia bits and the user bits are set previously, predetermined position information can be directly received from a internal position information storing means, and the multimedia bits and the user bits can be extracted from the received compressed data according to the predetermined position information. Furthermore, in the case in which the sending end resets the positions of and the user bits as required, the reset position information can be received from the sending end, and the multimedia bits and the user bits can be extracted from the received compressed data according to the received position information.

In step S5020, the multimedia bits are converted into a fourth data. In step S5030, the user bits are converted into a fifth data. As mentioned above, the fourth data corresponds to the first data and can have a first data amount equal to the data amount of the transmission unit, and a fifth data corresponds to the second data. In the case in which bits having more information amount denoting multimedia information are selected from among the first data as the multimedia bits at the sending end, the multimedia bits are filled according to the specified amount of bits contained in the first data, as the fourth data. Similarly, in the case in which bits having more information amount denoting user information are selected from among the second data as the user bits at the sending end, if the amount of the user bits is equal to specified amount of bits contained in the second data, the user bits are taken as the fifth data; and if the amount of the user bits is less than specified amount of bits contained in the second data, the user bits are filled according to the amount of bits contained in the second data, as the fifth data. In the case in which the first data is encoded as the multimedia bits at the sending end, the multimedia bits are decoded so as to obtain the fourth data. Similarly, in the case in which the second data is encoded as the user bits, the user bits are decoded so as to obtain the fifth data. That is to say, the fourth data may either be the same as the first data, or be the data obtained by decompressing the first data compressed with loss. Similarly, the fifth data may either be the same as the second data, or be the data obtained by decompressing the second data compressed with loss.

As mentioned above, in the case in which the formats of the first data and the second data are not changed frequently, the manners for obtaining the multimedia bits according to said first data and obtaining the user bits according to said second data can be set previously at the sending end and the receiving end. The respective operations are performed according to the previous setting when sending or receiving the data. On the contrary, in the case in which the formats of the first data and the second data change frequently, the manners can be reset as required before the data is sent, and information on the reset manners can be received from the sending end and the respective operations can be performed according to the received information.

Alternatively, in one embodiment of the present invention, decompressing the received compressed data so as to obtain the fourth data and the fifth data can also be achieved in the following way. The compressed data is first decoded so as to obtain a third data. The third data is obtained by combining the first data and the second data. The third data is then separated so as to obtain the fourth data and the fifth data. Similarly, in the case in which the formats of the first data and the second data are not changed frequently, the amount and/or positions of the first data and the second data in the third data can be set previously at the sending end and the receiving end. The respective operations are performed according to the previous setting when sending or receiving the data. On the contrary, in the case in which the formats of the first data and the second data change frequently, the manners can be reset as required before the data is sent, and information on the reset manners can be received from the sending end and the respective operations can be performed according to the received information.

The methods shown in FIGS. 4 and 5 will be described in detail below by taking the case in which video data having an Alpha value as the user data and having the RGB format are received by using a HDMI bus as an example. Corresponding to the methods described above by taking the case in which video data having an Alpha value as the user data and having the RGB format are sent by using a HDMI bus as an example, in this embodiment, the first data is image data and the second data is user data, and the specific transmission format is the HDMI transmission format. In accordance with the HDMI protocol, image data having formats such as RGB is transmitted in transmission units of pixels, each of which has a data amount of 24 bits. In this embodiment, the received compressed data is obtained by compressing image data and user data corresponding to one pixel, and the compressed data has a data amount equal to one pixel, i.e., 24 bits.

First, in step S4010 of the method 4000, a compressed data with a compressed data amount is received, that is, a compressed data having a data amount of 24 bits is received.

Then, in step S5010 of the method 5000, user bits and multimedia bits are separated from the compressed data. As mentioned above, in this embodiment, it is previously determined that, with respect to each pixel, the uppermost 6 bits of the color-value data of each color are selected as the multimedia bits, the uppermost 6 bits of the alpha value are selected as the user bits, and the user bits are divided evenly into 3 groups to be respectively appended after the multimedia bits of each color so as to constitute the compressed data. Therefore, in step S5010, the separation is performed according to the predetermined manner. In particular, in accordance with the HDMI protocol, the received compressed data is separated into 3 groups of red (R), green (G) and blue (B), and each groups has 8 bits. The multimedia bits are obtained by extracting the uppermost 6-bit data in each group of data, and the user bits are obtained by extracting the lowermost 2-bit data in each group of data and combining the extracted lowermost 2-bit data of the three groups in predetermined order.

Next, in step S5020 of the method 5000, the multimedia bits are converted into the fourth data corresponding to the first data, that is, the multimedia bits are converted into the fourth data corresponding to the image data. In particular, according to the structure of pixel data (not having an Alpha value) of the RGB format shown in Table 1, zeros are padded at the end of extracted 6-bit multimedia bits of the three groups, thereby the compressed image data is decompressed. The decompressed image data may be either exactly same as or slightly different from the original image data depending on the method of generating the multimedia bits at the sending end.

Finally, in step S5030 of the method 5000, the user bits are converted into the fifth data corresponding to the second data, that is, the user bits are converted into the fifth data corresponding to the user data. Similar to the method of obtaining the image data, according to the specification of the Alpha value, zeros are padded at the end of obtained user bits, thereby the fifth data is obtained. The decompressed Alpha value may be either exactly same as or slightly different from the original Alpha value depending on the method of generating the user bits at the sending end.

The example of receiving the video data having the Alpha value and having the RGB format in the HDMI protocol is shown above. Alternatively, the first data may be audio data and the second data may be system information data and so on.

A data sending apparatus of one embodiment of the present invention is illustrated below with reference to FIG. 6. As shown in FIG. 6, the data sending apparatus 600 of this embodiment includes a first acquiring module 610, a second acquiring module 620, a compressing module 630, and a sending module 640.

The individual modules of the data sending apparatus 600 can respectively perform the individual steps/functions of the data sending methods in FIGS. 2 and 3 mentioned above, therefore it will not be described in particular for the sake of simplicity.

For example, the first acquiring module 610 can acquire a first data corresponding to a transmission unit with a specific transmission format. The first data has a first data amount which is equal to the data amount of the transmission unit. The second acquiring module 620 can acquire a second data which corresponds to the transmission unit and has a second data amount. The compressing module 630 can compress the first data acquired by the first acquiring module 610 and the second data acquired by the second acquiring module 620 so as to obtain a compressed data with a compressed data amount. The compressed data amount is equal to or smaller than the data amount of the transmission unit. The sending module 640 can send the compressed data compressed by the compressing module 630.

Synchronous sending of multipath data sources can be achieved even in the case of inadequate channels by using the data sending device in this embodiment.

In a displaying device 600' of another embodiment of the present invention, the compressing module 630 can include a determining unit 631, a multimedia bit acquiring unit 632, and a user bit acquiring unit 633. The determining unit 631 is used to determine the amount and/or positions of multimedia bits and user bits in said compressed data corresponding to said transmission unit. The multimedia bit acquiring unit 632 is used to obtain the multimedia bits according to said first data. The user bit acquiring unit 633 is used to obtain the user bits according to said second data.

Figure 7:
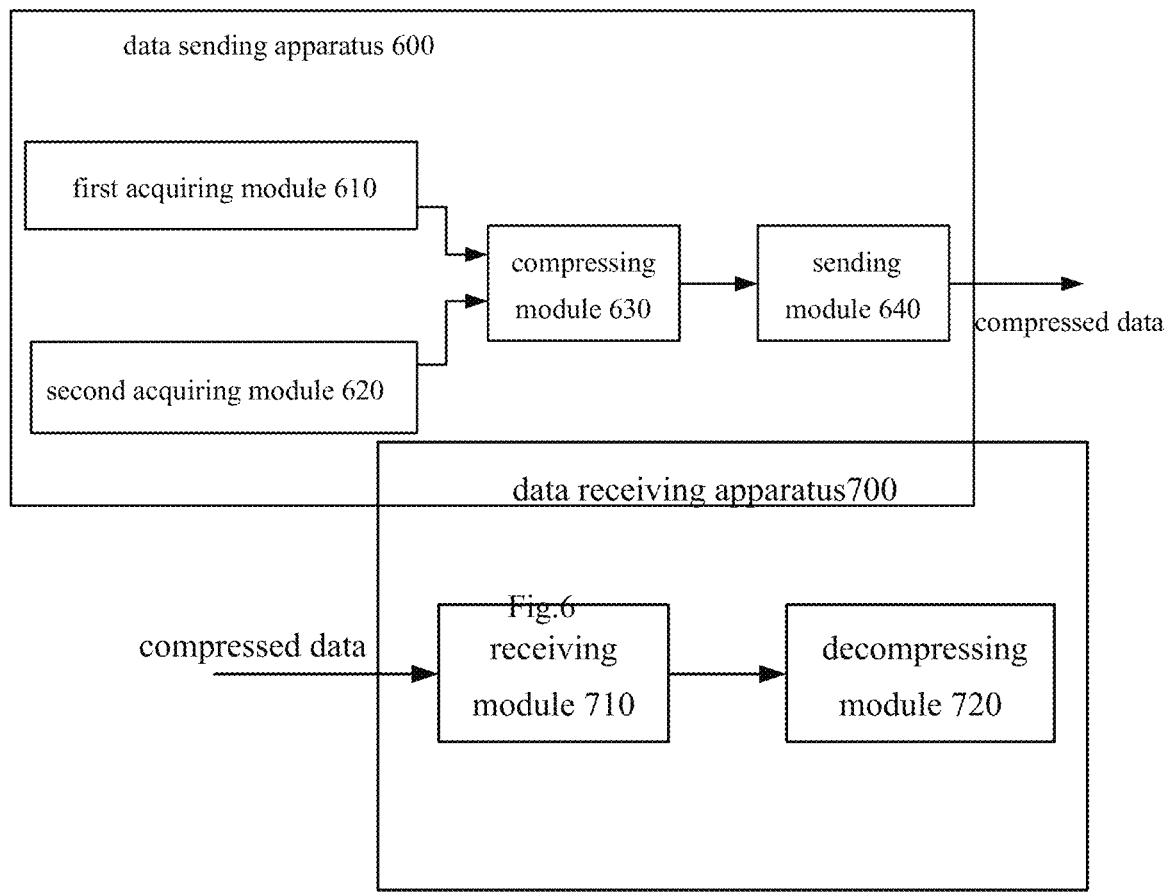
FIG. 7 is a block diagram showing a data receiving apparatus according to one embodiment of the present invention.

A data receiving apparatus of one embodiment of the present invention is illustrated below with reference to FIG. 7. As shown in FIG. 7, the data receiving apparatus 700 of this embodiment includes a receiving module 710 and a decompressing module 720.

The individual modules of the data receiving apparatus 700 can respectively perform the individual steps/functions of the data sending methods in FIGS. 4 and 5 mentioned above, therefore it will not be described in particular for the sake of simplicity.

For example, the receiving module 710 can receive a compressed data with a compressed data amount. The compressed data is obtained by compressing a first data and a second data corresponding to a transmission unit with a specific transmission format. The first data has a first data amount which is equal to the data amount of the transmission unit. And the compressed data amount is equal to or smaller than the data amount of the transmission unit. The decompressing module 720 can decompress the compressed data received by the receiving module 710 so as to obtain a first data and a second data.

Synchronous receiving of multipath data sources can be achieved even in the case of inadequate channels by using the data receiving device in this embodiment.

In a displaying device 700' of another embodiment of the present invention, the decompressing module 720 can include a separating unit 721, a first converting unit 722, and a second converting unit 723. The separating unit 721 is used to separate said user bits and multimedia bits from said compressed data. The first converting unit 722 is used to convert the multimedia bits into said first data. The first converting unit 722 is used to convert the user bits into said second data.

In another embodiment of the present invention, a data transmitting system including the sending apparatus and the receiving apparatus as described in FIGS. 6 and 7 is also provided. It will not be described in particular for the sake of simplicity.

The advantage of high bandwidth of the HDMI bus, the DisplayPort bus and the like can be utilized by using the data transmitting system in this embodiment. Even in the case of inadequate channels, multipath data sources can be transmitted synchronously, content mixture can be achieved, and user experience can be improved. The mixture function of picture contents achieved by the data sending apparatus of this embodiment will be described below with reference to FIG. 8.

Figure 8:
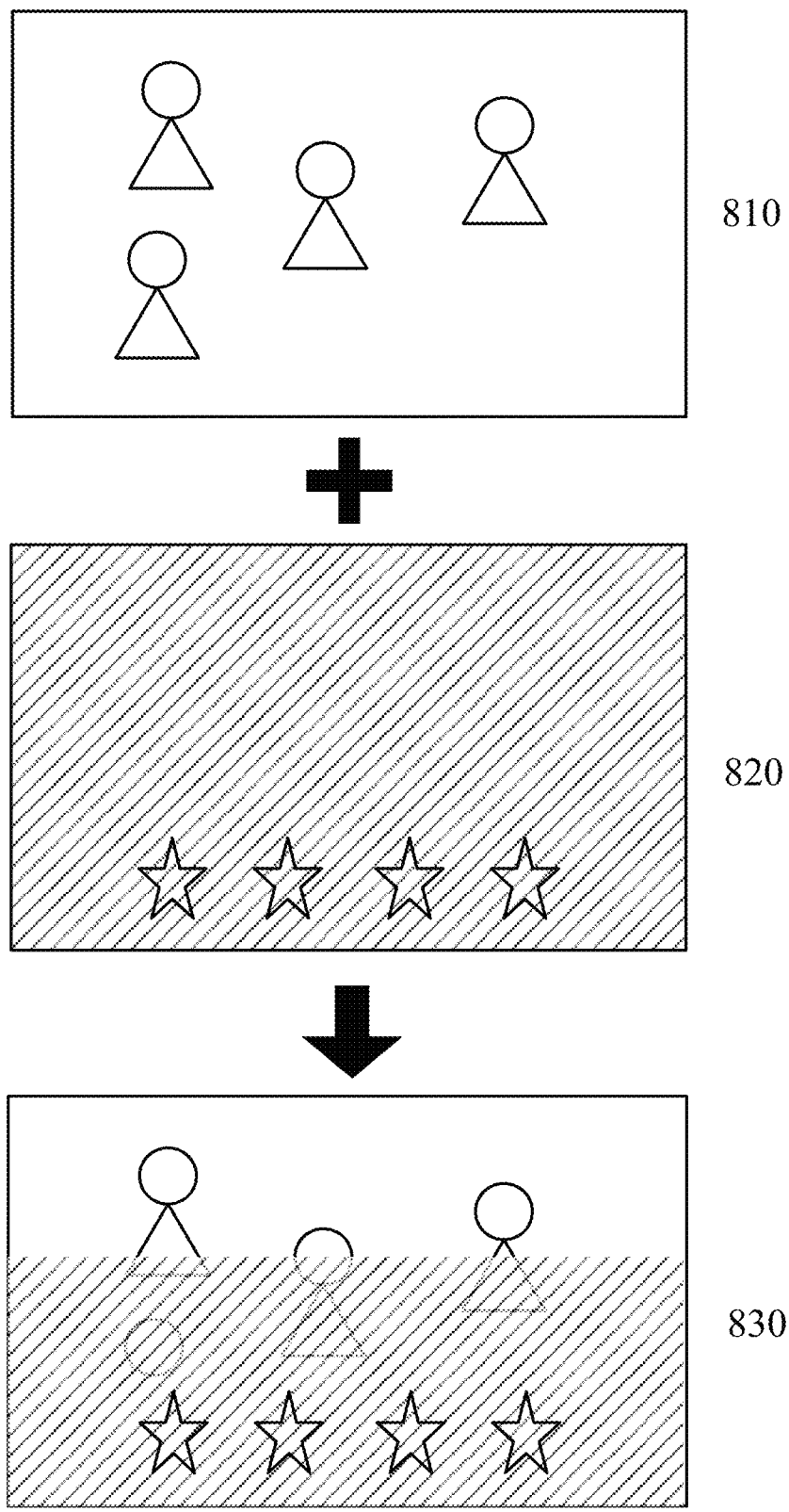
FIG. 8 is an illustration diagram showing an example of a double-picture-display function performed by a data transmitting system according to one embodiment of the present invention.

FIG. 8 shows an example of a double-picture-display function performed by a data transmitting system of this embodiment. In FIG. 8, video data of a first picture 810 originates from a television signal transmitted using a HDMI bus and only includes image data; while video data of a second picture 820 originates from the Internet or PCs, and includes image data and user data (e.g., a Alpha value) for controlling transparency. By using the data transmitting system of this embodiment, the video data of a second picture 820 originating from the Internet or PCs can also be transmitted using a HDMI bus. Because the image data and the user data are transmitted synchronously, the second picture 820 can be mixed with the first picture 810 with respect to picture contents. For example, the second picture 820 can be set into a semi-transparent state at sub area using the Alpha value, and the first picture 810 can be overlaid with it so as to generate a picture 830. Using the Alpha value, the upper part of the second picture 820 originating from the Internet or PCs is set into a completely transparent state, the middle part thereof is set into a semi-transparent state, and the lower part thereof is set into a completely opaque state. As shown in FIG. 8, the upper part of the picture 830 is the corresponding part of the first picture 810, the middle part thereof is the mixture of the contents of the corresponding parts of the first picture 810 and the second picture 820, and the lower part thereof is the corresponding part of the second picture 820 and the corresponding part of the first picture 810 is covered by the second picture 820. Thus, a sub area overlay effect is achieved on one picture so that user experience is improved. The overlay effect of overlaying a picture originating from a TV signal and a picture originating from the Internet or PCs by sub area is shown in FIG. 8, however, the achievement of the overlay effect in this embodiment is not limited to this. For example, overlaying with different transparency can be achieved on the basis of each pixel.

It should be noted that individual steps of the methods shown in FIGS. 2 to 5 are not necessarily executed in the shown order. The execution of some steps can be reversed or concurrent. For example, acquiring a first data corresponding to a transmission unit with a specific transmission format (S2010) and acquiring a second data, which corresponds to the transmission unit and has a second data amount (S2020), can be executed at the same time; or the step S2020 can be first executed and the step S2010 can be executed then.

Those having ordinary skills in the art can realize that the units and algorithm steps of the individual examples described in the embodiments, which are disclosed in the present description, can be implemented by electronic hardware, computer software or the combination thereof. In order to illustrate the interchangeability of the hardware and the software clearly, constitution and steps of each example have be described generally in the above illustration according to function. Whether these functions should be executed in the manner of hardware or software depends on the specific applications and the design constraints of the technical scheme. Different methods can be used by those skilled in the art for each specific application to implement the described functions, however, this implementation should not be considered as beyond the scope of the present invention.

It should be understood by those skilled in the art that various modifications, combinations, part-combinations and substitutions of the present invention may occur relying on design requirements and other factors insofar as they are within the scope of the appended claims or the equivalents thereof.

What is claimed is:

1. A data sending method, comprising:
   acquiring a first data corresponding to a transmission unit of pixel with HDMI transmission format, wherein said first data has a first data amount which is equal to the data amount of said transmission unit of pixel, and the first data is multimedia data of one pixel corresponding to the HDMI transmission format and for displaying a first picture;
   acquiring a second data which corresponds to said first data of said transmission unit of the pixel and has a second data amount, and the second data contains information for controlling transparencies of different sub areas of the first picture of the first data of the corresponding transmission unit of pixel, wherein at least one sub area having different transparency from those of the other sub areas;
   compressing said first data and said second data so as to obtain a compressed data with a compressed data amount, wherein said compressed data amount is equal to or smaller than the data amount of said transmission unit of pixel;
   sending said compressed data via a HDMI bus so as to display the first picture; and
   sending a third data for displaying a second picture via the HDMI bus, wherein the different sub areas of the first picture and the second picture are mixed based on the different transparencies of different sub areas of the first picture controlled by the information contained in the second data.

2. The data sending method of claim 1, said step of compressing said first data and said second data so as to obtain a compressed data with a compressed data amount comprises:
   combining said first data and said second data so as to obtain a third data;
   encoding said third data so as to obtain said compressed data.

3. The data sending method of claim 1, said step of compressing said first data and said second data so as to obtain a compressed data with a compressed data amount comprises:
   determining the amount and/or positions of multimedia bits and user bits in said compressed data corresponding to said transmission unit;
   obtaining the multimedia bits according to said first data;
   obtaining the user bits according to said second data.

4. The data sending method of claim 3, said step of obtaining the multimedia bits according to said first data comprises:
   selecting, from among said first data, bits having more information amount denoting multimedia information as said multimedia bits according to the determined amount and/or position of said multimedia bits.

5. The data sending method of claim 3, said step of obtaining the multimedia bits according to said first data comprises:
   encoding said first data as said multimedia bits according to the determined amount and/or position of said multimedia bits.

6. The data sending method of claim 3, said step of obtaining the user bits according to said second data comprises:
   selecting, from among said second data, bits having more information amount denoting user information as said user bits according to the determined amount and/or position of said user bits.

7. The data sending method of claim 3, said step of obtaining the user bits according to said second data comprises:
   encoding said second data as said user bits according to the determined amount and/or position of said user bits.

8. A data receiving method, comprising:
   receiving a compressed data with a compressed data amount via a HDMI bus, wherein said compressed data is obtained by compressing a first data and a second data corresponding to a transmission unit of pixel with HDMI transmission format, said first data having a first data amount which is equal to the data amount of said transmission unit of pixel, the first data is multimedia data of one pixel corresponding to the HDMI transmission format and for displaying a first picture, the second data contains information for controlling transparencies of different sub areas of the first picture of the first data of the corresponding transmission unit of pixel, wherein at least one sub area having different transparency from those of the other sub areas, said compressed data amount being equal to or smaller than the data amount of said transmission unit;
   decompressing the received compressed data so as to obtain a fourth data and a fifth data,
   receiving a third data for displaying a second picture via the HDMI bus,
   wherein said fourth data corresponds to said first data, and said fifth data corresponds to said second data,
   wherein the different sub areas of the first picture and the second picture are mixed based on the different transparencies of different sub areas of the first picture controlled by the information contained in the second data.

9. The data receiving method of claim 8, wherein said compressed data comprises multimedia bits and user bits, and said step of decompressing the received compressed data so as to obtain a fourth data and a fifth data comprises:
   separating said user bits and the multimedia bits from said compressed data;
   converting said multimedia bits into said fourth data; and
   converting said user bits into said fifth data.

10. The data receiving method of claim 9, further comprising:
   receiving the determined amount and/or positions of the multimedia bits and the user bits in said compressed data corresponding to said transmission unit.

11. The data receiving method of claim 8, wherein said compressed data comprises multimedia bits and user bits, and said step of decompressing the received compressed data so as to obtain a fourth data and a fifth data comprises:
   decoding said compressed data so as to obtain a third data, wherein said third data is obtained by combining said first data and said second data;
   separating said third data so as to obtain said fourth data and the fifth data.

12. A data sending apparatus, comprising:
   a first acquiring module for acquiring a first data corresponding to a transmission unit of pixel with HDMI transmission format, wherein said first data has a first data amount which is equal to the data amount of said transmission unit of pixel, and the first data is multimedia data of one pixel corresponding to the HDMI transmission format and for displaying a first picture;
   a second acquiring module for acquiring a second data which corresponds to said first data of said transmission unit of pixel and has a second data amount, and the second data contains information for controlling transparencies of different sub areas of the first picture of the first data of the corresponding transmission unit of pixel, wherein at least one sub area having different transparency from those of the other sub areas;
   a compressing module for compressing the first data acquired by said first acquiring module and the second data acquired by said second acquiring module so as to obtain a compressed data with a compressed data amount, wherein said compressed data amount is equal to or smaller than the data amount of said transmission unit of pixel;
   a sending module for sending the compressed data compressed by said compressing module via a HDMI bus so as to display the first picture; and
   the sending module further for sending a third data for displaying a second picture via the HDMI bus,
   wherein the different sub areas of the first picture and the second picture are mixed based on the different transparencies of different sub areas of the first picture controlled by the information contained in the second data.

13. A data receiving apparatus, comprising:
   a receiving module for receiving a compressed data with a compressed data amount via a HDMI bus, wherein said compressed data is obtained by compressing a first data and a second data corresponding to a transmission unit of pixel with HDMI transmission format, said first data having a first data amount which is equal to the data amount of said transmission unit of pixel, the first data is multimedia data of one pixel corresponding to the HDMI transmission format and for displaying a first picture, the second data contains information for controlling transparencies of different sub areas of the first picture of the first data of the corresponding transmission unit of pixel, wherein at least one sub area having different transparency from those of the other sub areas, said compressed data amount being equal to or smaller than the data amount of said transmission unit;

a decompressing module for decompressing the compressed data received by said receiving module so as to obtain a fourth data and a fifth data, the receiving module further for receiving a third data for displaying a second picture via the HDMI bus, wherein said fourth data corresponds to said first data, and said fifth data corresponds to said second data, wherein the different sub areas of the first picture and the second picture are mixed based on the different transparencies of different sub areas of the first picture controlled by the information contained in the second data.

14. A data transmitting system, comprising a sending apparatus and a receiving apparatus, said sending apparatus comprising:

a first acquiring module for acquiring a first data corresponding to a transmission unit of pixel with HDMI transmission format, wherein said first data has a first data amount which is equal to the data amount of said transmission unit of pixel, and the first data is multimedia data of one pixel corresponding to the HDMI transmission format and for displaying a first picture;

a second acquiring module for acquiring a second data which corresponds to said first data of said transmission unit of pixel and has a second data amount, and the second data contains information for controlling transparencies of different sub areas of the first picture of the first data of the corresponding transmission unit of pixel, wherein at least one sub area having different transparency from those of the other sub areas;

a compressing module for compressing the first data acquired by said first acquiring module and the second data acquired by said second acquiring module so as to obtain a compressed data with a compressed data amount, wherein said compressed data amount is equal to or smaller than the data amount of said transmission unit of pixel;

a sending module for sending the compressed data compressed by said compressing module, the sending module further for sending a third data for displaying a second picture via the HDMI bus, wherein the different sub areas of the first picture and the second picture are mixed based on the different transparencies of different sub areas of the first picture controlled by the information contained in the second data, said receiving apparatus comprising:

a receiving module for receiving the compressed data with the compressed data amount, wherein said compressed data is obtained by compressing the first data and the second data corresponding to the transmission unit with the HDMI transmission format, said first data having the first data amount which is equal to the data amount of said transmission unit of pixel, said compressed data amount being equal to or smaller than the data amount of said transmission unit of pixel;

a decompressing module for decompressing the compressed data received by said receiving module so as to obtain a fourth data and a fifth data, wherein said fourth data corresponds to said first data, and said fifth data corresponds to said second data.

* * * * *